(12) United States Patent
Ramalingam et al.

(10) Patent No.: US 9,870,169 B2
(45) Date of Patent: Jan. 16, 2018

(54) INTERLEAVED ALL-LEVEL PROGRAMMING OF NON-VOLATILE MEMORY

(71) Applicant: INTEL CORPORATION, Santa Clara, CA (US)

(72) Inventors: Anand S. Ramalingam, Beaverton, OR (US); Dale J. Juenemann, North Plains, OR (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/846,102

(22) Filed: Sep. 4, 2015

(65) Prior Publication Data
US 2017/0068482 A1 Mar. 9, 2017

(51) Int. Cl.
*G11C 11/56* (2006.01)
*G06F 3/06* (2006.01)
(Continued)

(52) U.S. Cl.
CPC ............ *G06F 3/0647* (2013.01); *G06F 3/061* (2013.01); *G06F 3/0685* (2013.01); *G06F 12/0804* (2013.01); *G06F 12/0868* (2013.01); *G11C 11/5628* (2013.01); *G06F 2212/1032* (2013.01); *G06F 2212/214* (2013.01); *G06F 2212/225* (2013.01); *G06F 2212/261* (2013.01); *G06F 2212/7203* (2013.01); *G11C 2211/5648* (2013.01)

(58) Field of Classification Search
CPC .................................................. G11C 11/5628
See application file for complete search history.

(56) References Cited

U.S. PATENT DOCUMENTS

| 9,021,227 B2 | 4/2015 | Karpov et al. |
| 2011/0134685 A1* | 6/2011 | Kau ................... G11C 13/0004 365/163 |

(Continued)

OTHER PUBLICATIONS

Eshghi, K., et al., "SSD Architecture and PCI Express Interface," Inside Solid State Drives (SSDs), Springer Series in Advanced Microelectronics 37, DOI 10. 2013. 28 pages.
(Continued)

*Primary Examiner* — Edward Dudek, Jr.
(74) *Attorney, Agent, or Firm* — Finch & Maloney PLLC

(57) ABSTRACT

Techniques are disclosed for programming memory devices such as solid-state drives. In an embodiment, a memory controller is configured to execute a programming sequence that interleaves coarse and fine tuning steps for neighboring word lines. In one example, three consecutive word lines are programmed in six steps. At step 1, word line n is coarse programmed to an intermediate voltage level; at step 2, word line n+1 is coarse programmed to an intermediate voltage level; at step 3, word line n is fine programmed to its target voltage level; at step 4, word line n+2 is coarse programmed to an intermediate voltage level; at step 5, word line n+1 is fine programmed to its target voltage level; at step 6, word line n+2 is fine programmed to its target voltage level. No reads are allowed until all cell levels are programmed. Phase change memory may be used as staging buffer.

25 Claims, 4 Drawing Sheets

(51) Int. Cl.
G06F 12/0804 (2016.01)
G06F 12/0868 (2016.01)

(56) References Cited

U.S. PATENT DOCUMENTS

| | | | |
|---|---|---|---|
| 2012/0131265 A1* | 5/2012 | Koltsidas | G06F 12/0868 711/103 |
| 2013/0304978 A1 | 11/2013 | Trika et al. | |
| 2015/0186257 A1 | 7/2015 | Ramalingam et al. | |
| 2016/0070488 A1* | 3/2016 | Shaharabany | G06F 3/0619 711/103 |
| 2016/0110252 A1* | 4/2016 | Hyun | G11C 29/52 714/766 |

OTHER PUBLICATIONS

Cornwell, Michael, "Anatomy of a Solid-state Drive," File Systems and Storage, Oct. 17, 2012, vol. 10, issue 10. 17 pages.
"Micron Technical Note NAND Flash 101: An Introduction to NAND Flash and How to Design it in to Your Next Product," Micron Technology, Inc., 2006. pp. 1-27.
Faltus, Radovan, "Solid state drives: Backup capacitors in modern solid state drives," AVX spol.s.r.o., May 1, 2011. 8 pages.
"How Micron SSDs Handle Unexpected Power Loss," A Micron White Paper, Micron Technology, Inc., 2014. pp. 1-4.

* cited by examiner

INTERLEAVED ALL-LEVEL PROGRAMMING OF NON-VOLATILE MEMORY

BACKGROUND

A solid-state drive (SSD) is a storage device that can be used as an alternative to hard disk drives. Unlike a hard disk drive, an SSD contains no moving parts and uses semiconductor memory for its storage element. A typical semiconductor memory used in SSDs is NAND flash non-volatile memory, such as also used in USB flash memory. SSDs may also be implemented with NOR flash non-volatile memory, although NAND flash is generally more common given its various benefits, including a relatively small footprint as compared to NOR-based flash. In any case, an SSD controller provides a block access interface (512 B multiple) to the host controller. The controller is typically implemented with a processor configured to carry out NAND/media management functions, such as reading/writing of data, encryption, error correction, wear leveling, and garbage collection. A typical NAND controller operates in block mode (e.g., 512 B multiples for reads and writes). NAND based SSDs use parallelism by engaging multiple NAND chips to deliver superior input/output performance compared to hard disk drives. As newer and cheaper generations of NAND SSDs are built based on smaller lithography, more cells per area are achieved. In addition, and regardless of the lithography, more information can be packed in a single cell by using multiple level programming, such as the case with SSDs that use three level cells (TLC) or Quad level cell (QLC) NAND technology. As bits of information per cell increases, the time it takes to program each bit goes up considerably due to the precision required to program each level. This exposes the SSD to complex recovery mechanisms during surprise power loss and large buffering scenarios, making the SSD controller complex and expensive.

DETAILED DESCRIPTION

Figure 1:
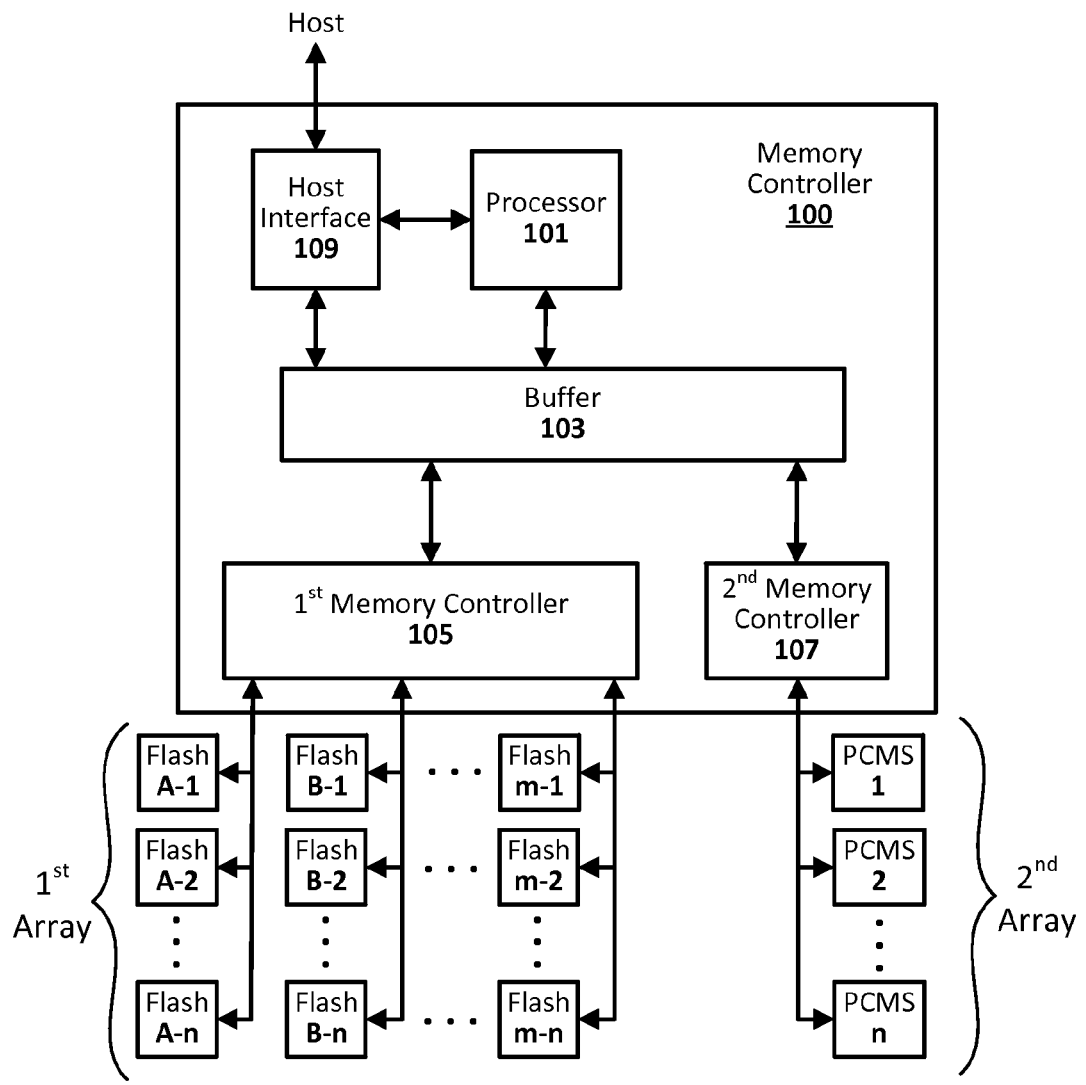
FIG. 1 illustrates a storage system configured in accordance with an embodiment of the present disclosure.

Techniques are disclosed for programming memory devices such as solid-state drives (SSDs) having a multi-level cell mode, such as NAND-based flash devices. In an embodiment, an SSD controller is configured to execute a programming sequence that interleaves coarse and fine tuning steps for neighboring word lines. For instance, in one example case, three consecutive word lines are programmed in a six step sequential process. At step 1, word line 1 is coarse programmed to an intermediate voltage level, then at step 2, word line 2 is coarse programmed to an intermediate voltage level. At step 3, word line 1 is fine programmed to its target voltage level, then at step 4, word line 3 is coarse programmed to an intermediate voltage level. At step 5, word line 2 is fine programmed to its target voltage level, then at step 6, word line 3 is fine programmed to its target voltage level. Note that impact to an initial coarse programming state of a given word line due to subsequent coarse programming of a neighboring word line can be mitigated during the subsequent fine programming of that given word line. In an embodiment, no reads are allowed until all the levels in a given cell are programmed. A sawtooth pattern of programming voltage can be used to provide high reliability to the final programmed states, given that the fine adjustment of a given cell happens after the adjacent page has gone through a first round of coarse programming. Such an interleaved multi-step programming sequence of adjacent word lines (or pages) minimizes or otherwise reduces the impact on uncorrectable bit error rate due to programming in adjacent word lines causing a disturb effect on a previously programmed neighboring cell. In one example scenario, a host system writes data to an SSD through a host interface. The data is temporarily buffered and then written immediately to a phase change memory with switch (PCMS), although other suitable non-volatile memory can be used as well. Once enough data is written to the PCMS, then the SSD processor issues a move (or copy) of the data from the PCMS to NAND flash using the interleaved programming sequence. Due to the property of very high read bandwidth on the PCMS, the buffering levels can be much smaller relative to NAND. Other embodiments may be implemented with other types of non-volatile memory and the present disclosure is not intended to be limited to PCMS and NAND flash, or any other specific memory types. Numerous variations and configurations will be apparent in light of this disclosure. In addition, further note that reference herein to "moving" data (including variants, such as "move" or "moved" or "movable" data) is intended to include operations where the data being moved no longer exists in the original location from which it is moved as well as operations where the data being moved is copied or otherwise may remain in the original location from which it is moved for a period of time or even indefinitely. Unless expressly indicated to the contrary, the term move and its variants as used herein are intended to include all such operations.

General Overview

A NAND cell stores charge (electrons) in a non-volatile manner, such that no power is needed to persist the stored charge. Example NAND memory technologies can be implemented with a number of different architectures such as, for instance, floating gate MOSFET flash and charge trap flash. In any such cases, there are effectively three types of operations that can operate on a NAND cell: read, erase, and write. During a read operation, stored charge of the cell is sensed by readout circuitry without changing the stored charge. During an erase operation, charge is removed from the cell. During a write or 'programming' operation, charge is added to the cell. As is known, a NAND cell must be erased before it can be programmed. Erasing is carried out in blocks, each block including multiple word lines, each word line including one or more pages, and each page including multiple cells. Note that each word line may be partitioned into multiple pages. In any case, programming generally involves repetitively applying a pulse of high voltage to the target cell until the proper voltage value has been programmed into that cell. That programmed voltage level decodes into one or more bits, depending on the bit level of the cell. A single-level cell (SLC) stores a single bit of data and has two program voltage values. Thus, for instance, the first program voltage translates to the single bit being a logic 0 and the second program voltage translates to the single bit being a logic 1. In a similar fashion: a multi-level cell (MLC) stores two bits of data and has four program voltage values; a three-level cell (TLC) stores three bits of value with eight program voltage values; and a quad-level cell (QLC) stores four bits of value with sixteen program voltage values. Tables 1 through 4 show the decoding scheme for each cell type (SLC, MLS, TLC, and QLC), including the programmed voltage values and corresponding bits represented by each of those voltages.

TABLE 1

SLC Logic

| $V_{prog}$ | Bit 1 |
|---|---|
| $V_1$ | 0 |
| $V_2$ | 1 |

TABLE 2

MLC Logic

| $V_{prog}$ | Bit 1 | Bit 1 |
|---|---|---|
| $V_1$ | 0 | 0 |
| $V_2$ | 0 | 1 |
| $V_3$ | 1 | 0 |
| $V_4$ | 1 | 1 |

TABLE 3

TLC Logic

| $V_{prog}$ | Bit 1 | Bit 2 | Bit 3 |
|---|---|---|---|
| $V_1$ | 0 | 0 | 0 |
| $V_2$ | 0 | 0 | 1 |
| $V_3$ | 0 | 1 | 0 |
| $V_4$ | 0 | 1 | 1 |
| $V_5$ | 1 | 0 | 0 |
| $V_6$ | 1 | 0 | 1 |
| $V_7$ | 1 | 1 | 0 |
| $V_8$ | 1 | 1 | 1 |

TABLE 4

QLC Logic

| $V_{prog}$ | Bit 1 | Bit 2 | Bit 3 | Bit 4 |
|---|---|---|---|---|
| $V_1$ | 0 | 0 | 0 | 0 |
| $V_2$ | 0 | 0 | 0 | 1 |
| $V_3$ | 0 | 0 | 1 | 0 |
| $V_4$ | 0 | 0 | 1 | 1 |
| $V_5$ | 0 | 1 | 0 | 0 |
| $V_6$ | 0 | 1 | 0 | 1 |
| $V_7$ | 0 | 1 | 1 | 0 |
| $V_8$ | 0 | 1 | 1 | 1 |
| $V_9$ | 1 | 0 | 0 | 0 |
| $V_{10}$ | 1 | 0 | 0 | 1 |
| $V_{11}$ | 1 | 0 | 1 | 0 |
| $V_{12}$ | 1 | 0 | 1 | 1 |
| $V_{13}$ | 1 | 1 | 0 | 0 |
| $V_{14}$ | 1 | 1 | 0 | 1 |
| $V_{15}$ | 1 | 1 | 1 | 0 |
| $V_{16}$ | 1 | 1 | 1 | 1 |

As will be appreciated, the requisite precision of the programming voltage increases as the levels that the storage cell supports increases. This need for programming voltage precision in turn can slow the programming process and reduce performance of the flash storage device. This slowing can be further exacerbated due to the need to erase-before-programming. To this end, better programming techniques are needed for memory cells, particularly those that support multiple bit levels.

Thus, and in accordance with an embodiment of the present disclosure, a memory programming technique is disclosed wherein multi-level cell programming can be carried out in a sequential process that interleaves intermediate and final programming steps of neighboring word line cells, and wherein all levels of a given multi-level storage cell are programmed before performing any reads. Such programming techniques allow the storage device to encode the levels of the cells potentially providing better sustained performance, and may be particularly useful in NAND flash, although they can also be used in other memory cell technologies where the programming of one cell can impact the programming of a neighboring cell. As will be appreciated in light of this disclosure, the techniques further allow for elimination of dynamic random access memory (DRAM) for buffering (and other uses) as well as elimination of capacitor-based storage for surprise power loss scenarios.

In an embodiment, a host system writes data to an SSD or other memory device through a host interface, and the received data is stored in a buffer. The buffer may be volatile or non-volatile, and acknowledgement of write completion can be provided to the host system to facilitate intra-system communication. If volatile buffer memory is used, data loss may occur, without taking some further precaution to persist data in the event of surprise power loss. In one example case, the data buffering is accomplished using a non-volatile phase change memory with switch (PCMS) array, which has relatively fast read-out rate and small foot print relative to other memory types such as random access memory (RAM). In one such case, the data is temporarily buffered (e.g., RAM or other suitable buffer space) but is then written immediately to the PCMS using a PCMS controller. Once enough data is buffered in the PCMS storage (or other buffer), then the processor of the SSD commences writing that buffered data to, for example, NAND memory in a sequential and interleaved process, wherein each cell is programmed at least twice (once for coarse tuning and once again for fine tuning). No reads are allowed until all the levels in a given cell are programmed. Although the amount of data buffered can vary from one embodiment to the next, in one example case, the amount includes three sequential word lines of data.

The sequential interleaved write process may be implemented in any number of ways, as will be appreciated in light of this disclosure. In one example embodiment employing a QLC NAND cell mode, three consecutive word lines are programmed in a six step sequential process as follows: at step 1, word line n is coarse programmed to an intermediate voltage level; at step 2, word line n+1 is coarse programmed to an intermediate voltage level; at step 3, word line n is fine programmed to its target voltage level (note that any impact to the initial coarse programming state of word line n due to subsequent coarse programming at step 2 has been reduced/eliminated during fine programming at step 3); at step 4, word line n+2 is coarse programmed to an intermediate voltage level; at step 5, word line n+1 is fine programmed to its target voltage level (note that any impact to the initial coarse programming state of word line n+1 due to subsequent coarse programming at step 4 has been reduced/eliminated during fine programming at step 5); at step 6, word line n+2 is fine programmed to its target voltage level, thereby completing all-level programming for these three word lines.

In another example embodiment, each word line is partitioned into N pages and each level of a cell is associated with a different page. In this way, if one voltage is incorrect, it doesn't impact all N pages. For instance, in one example such case having a quad-level call mode, each word line can be partitioned into four pages: a first page for the first of the 4-bits per cell in the given word line, a second page for the second of the 4-bits per cell in the given word line, a third page for the third of the 4-bits per cell in the given word line, and a fourth page for the fourth of the 4-bits per cell in the given word line. In one such case employing a flash memory configured with a QLC NAND cell mode, three consecutive word lines (or twelve pages) are programmed in a six step sequential process as follows: at step 1, pages 0 and 1 of word line n are coarse programmed to intermediate voltage levels; at step 2, pages 2 and 3 of word line n+1 are coarse programmed to intermediate voltage levels; at step 3, pages 4 and 5 (along with coarsely programmed pages 0 and 1) of word line n are fine programmed to target voltage levels (note that any impact to the initial coarse programming state of word line n due to subsequent coarse programming at step 2 has been reduced/eliminated during fine programming at step 3); at step 4, pages 6 and 7 of word line n+2 are coarse programmed to intermediate voltage levels; at step 5, pages 8 and 9 (along with coarsely programmed pages 2 and 3) of word line n+1 are fine programmed to target voltage levels (note that any impact to the initial coarse programming state of word line n+1 due to subsequent coarse programming at step 4 has been reduced/eliminated during fine programming at step 5); at step 6, pages 10 and 11 (along with coarsely programmed pages 6 and 7) of word line n+2 are fine programmed to target voltage levels. Upon conclusion of the interleaved programming process, all four cell levels for all three word lines (including four pages per word line for a total of twelve pages) are fully programmed with the written data.

As explained herein, some embodiments implement all-level interleaved programming by using PCMS as an incoming host data staging buffer prior to writing to flash, although any suitable staging buffer can be used, as will be appreciated in light of this disclosure. A sawtooth pattern of programming voltage can be used to potentially provide high reliability to the final programmed states, given that the fine adjustment of a NAND cell or other programmable cell type happens after the adjacent word line (or page) has gone through a first coarse or otherwise preliminary round of programming.

In some cases, SLC based write buffering can be used to deliver improved burst write performance temporarily, but such cases may not alter the sustained TLC/QLC performance. In addition, existing solutions require DRAM buffering for optimal TLC performance but can come at the expense of data loss during surprise power loss. An additional short coming for existing solutions can be that form factors like ball grid array (BGA) packaging is highly space constrained and typically does not have enough space for a DRAM component. PCMS-based write buffering along with an all-level interleaved programming process as provided by one embodiment herein may overcome shortcomings of a costly amount of write data buffer levels along with elimination of the DRAM buffer. By using PCMS as a staging area for host write data, multi-level flash cells such as QLC NAND can achieve much higher sustained performance.

A memory device implemented in accordance with some embodiments can also perform the following example functionality. For instance, in one example embodiment configured with a first memory array including logical block addresses (LBAs) implemented with NAND, a write to a small span of the LBAs can be made with the Forced Unit Access (FUA) bit set, and then that span can be read back immediately. The service time for the write+read may be, for example, less than 300 uSec, when using PCMS or other comparable non-volatile memory as a second memory staging buffer (PCMS technology is one example that may perform the write+read in<300 uSec). With a second memory staging buffer implemented with traditional SLC NAND, reads going to first memory blocks having traditional NAND programming in process typically will take 500 uSec or more, as reads and writes cannot occur concurrently in such a buffering scheme. Further note that probing, for example, the NAND data bus during a program cycle can reveal if all-level programming is being used, according to some embodiments.

Architecture and Methodology

FIG. 1 illustrates a storage system configured in accordance with an embodiment of the present disclosure. As can be seen, the system includes a memory controller 100 operatively coupled with a first array of memory devices (A-1 . . . A-n, B1 . . . Bn, . . . m1 . . . mn, which are implemented with flash in this example embodiment) and a second array of memory devices (1, 2, . . . n, which are implemented with PCMS in this example embodiment). The controller 100 includes processor 101, a buffer 103, a first memory controller 105, a second memory controller 107, and a host interface 109. Processor 101 can include one or more processor cores, and may be distributed. At least one of processor 101, buffer 103, first memory controller 105, and second memory controller 107 can be programmed or otherwise configured to execute or direct all-level interleaved programming as provided herein, in accordance with an embodiment. In addition, the components are arranged and interconnected to facilitate all-level interleaved programming. Other suitable arrangements and interconnection schemes capable of achieving such all-level interleaved programming will be apparent in light of this disclosure. In one example embodiment, the memory devices of the M×N first memory array may be implemented, for example, with NAND flash in which case controller 105 can be a NAND controller, although other memory device/controller schemes can be used. The memory devices of the second memory array may be implemented, for example, with PCMS in which case controller 107 can be a PCMS controller, although again other comparable or otherwise suitable memory device/controller schemes can be used. The size of the first and second memory arrays can vary from one embodiment to the next, as will be appreciated. Buffer 103 may be implemented, for instance, with static RAM (SRAM) or some other suitable fast access on-chip memory or caching/buffer technology. Buffer 103 can be a volatile memory in some embodiments, but may be non-volatile in others. In an alternative embodiment, note that buffer 103 may be on-chip cache of processor 101. Host interface 109 may also be programmed or otherwise configured into processor 101.

In operation, a host computing system (e.g., desktop, laptop, mobile phone, tablet, etc) writes data to the storage system through interface 109. The data is temporarily buffered in buffer 103 and written immediately to the second array (e.g., PCMS or other suitable non-volatile storage) using the controller 107. This buffering may occur directly from the interface 109 to the buffer 103, or via the processor 101. Once data is written in the second array, processor 101 may send an acknowledgement to the host to indicate that the data transfer is complete. Once enough data gets buffered or staged in the second array, the processor 101 issues a move (or copy, as the case may be) of the data from the second array to the first array. Further note that, due to the property of very high read bandwidth on the second array according to an embodiment, the data buffering levels may be smaller relative to a lower read bandwidth memory type (e.g., a second array implemented with PCMS has a much higher read bandwidth than a second array implemented with SLC NAND memory). In one example case, three successive word lines are programmed in the first memory array, wherein each word line is initially coarse programmed and then fine programmed in an interleaved fashion with respect to a neighboring word line, thereby providing a six step programming sequence. Other embodiments may program a larger number of successive word lines and have a greater number of programming steps (e.g., four successive word lines with eight steps, or five successive word lines with ten steps, etc), or a smaller number of successive word lines and programming steps (e.g., two successive word lines with four steps).

The host interface 109 may be implemented with any suitable protocol, such as SATA, PCIe, SATA SAS, or other interface scheme that facilitates the exchange of information between functional components of controller 100 and the host data source. The first memory controller 105 is responsive to processor 101 or otherwise configured to carry out the all-level programming scheme in conjunction with other components of controller 100, and may further operate to manage data stored by the first memory array. For example, controller 105 may be a NAND flash controller and be configured to manage initialization, read operations, write operations, erase operations, error handling wear leveling, block selection and/or garbage collection for the first memory array (which could be NAND flash array). The second memory controller 107 is responsive to processor 101 or otherwise configured to carry out the all-level programming scheme in conjunction with other components of controller 100, and may further operate to manage data stored in the second array. For example, controller 107 may be a PCMS controller and be configured to manage initialization, read operations, write operations, erase operations, error handling, wear leveling and/or garbage collection for the second array (which could be a PCMS array).

PCMS is non-volatile and refers to phase change memory with switch (although some refer to it as stacked PCM). In alternative embodiments, other non-volatile storage technologies may be utilized to implement the second memory array, such as ferroelectric transistor random access memory (FeTRAM), nanowire memory, or memristor memory, wherein an appropriate controller can be used in place of controller 107. In one embodiment, the second array is used to buffer write data and/or store frequently used data, and may also be used to store a firmware image that may be used to for restoration/restart purposes. In one specific example embodiment, the staging array (second array) is implemented with cross point architecture, which provides a three-dimensional grid with transistor-less memory cells arranged at the intersection of words lines and bit lines, thereby allowing the cells to be individually addressed. As a result, data can be written and read in small sizes (e.g., byte-addressable). Each memory cell includes a selector and stores a single bit of data, according to one such embodiment. Memory cells are accessed and written or read by varying the amount of voltage sent to each selector. This eliminates the need for transistors, increasing capacity and reducing cost.

In some cases, PCMS memory technology provides the ability to write in 256 B to 1 KB granularity without the necessity to erase a block prior to writing. PCMS memory technology also provides significantly improved write bandwidth at these small write granularities with the cost per bit being comparable to SLC NAND. In addition, PCMS memory technology comes with considerably enhanced endurance (ability to write to a cell multiple times) compared to SLC NAND (1 million cycles+vs 100K cycles). If PCMS is not used, the content to be written to the flash array may also be buffered in, for example, DRAM/SRAM, although such memory may be susceptible to data loss during power loss. In either case, the buffering provided allows the programming routine to avoid having to be suspended in the middle of the programming sequence.

Figure 2A:
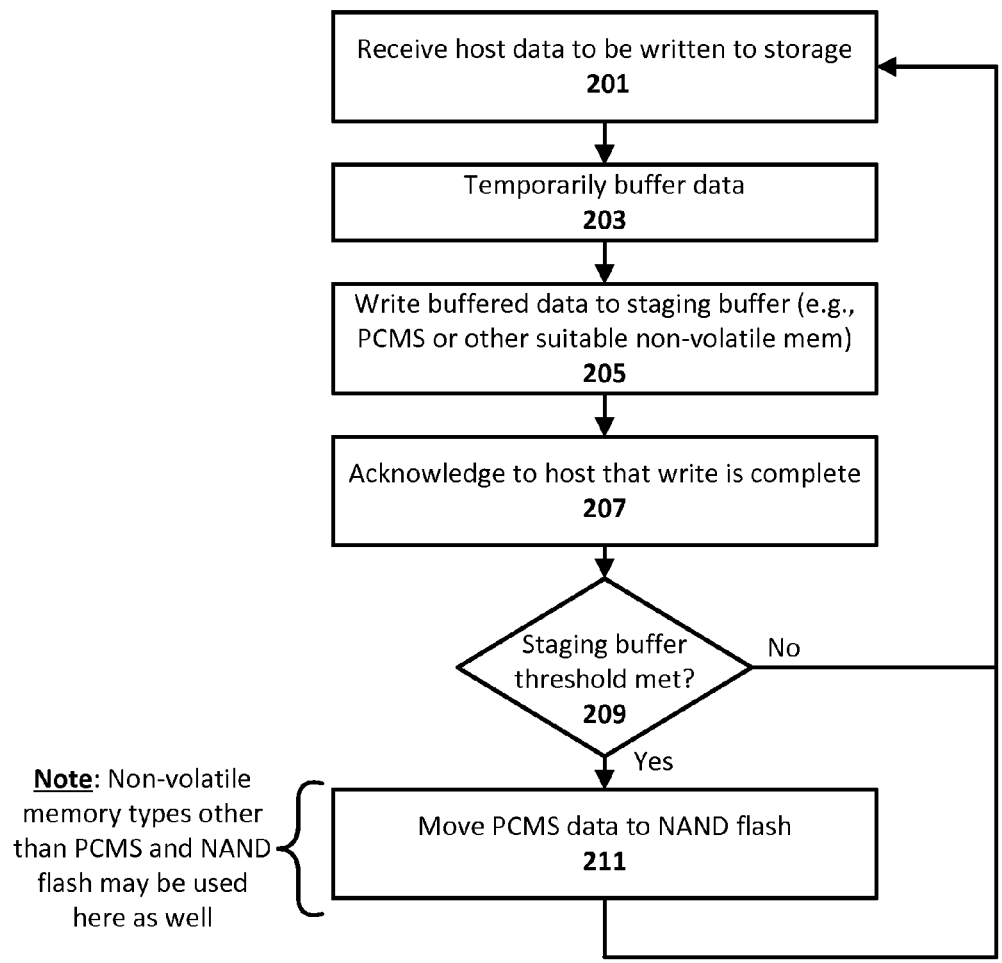
FIGS. 2a-c collectively illustrate a methodology for writing data to a storage system, in accordance with one or more embodiments of the present disclosure.

FIG. 2a illustrates a method for writing data to a storage system, in accordance with an embodiment of the present disclosure. The method may be carried out, for example, by the processor 101 of controller 100, which in turn utilizes and/or directs each of buffer 103, first memory controller 105, and second memory controller 107, as will be appreciated in light of this disclosure. To this end, the method may be implemented in software, hardware (e.g., gate level logic or purpose built semiconductor), firmware, or any combination thereof. In addition to carrying out the programming methodology provided herein, the controller 100 may also carry out conventional functionality. Further note that, while the example embodiment is shown in the context of PCMS and NAND memories, any number of suitable non-volatile memories can be used, and the present disclosure is not intended to be limited to any particular memory types. To this end, example non-volatile memories include NAND memory, NOR memory, PCMS, or some other suitable non-volatile memory, such as a byte addressable three dimensional cross point memory, a resistive memory, nanowire memory, ferro-electric transistor random access memory (FeTRAM), magnetoresistive random access memory (MRAM) memory that incorporates memristor technology, spin transfer torque (STT)-MRAM, byte addressable random access non-volatile memory, to name a few. In a more general sense, any programmable memory types that can benefit from the various interleaved programming processes provided herein can be used.

With reference to FIG. 2a, the method includes receiving, at 201, host data to be written to the storage system. The source data can be received by the host interface 109 and can be any type of data, such as a text document, a photo or image, an video or audio file, or a rich media document, to name a few examples. At 203, the method continues with temporarily buffering the data, such as done using buffer 103. Note that this buffering may occur, for example, within processor 101 or controller 107, rather than an external buffer 103. In still other embodiments, no such intermediate buffering is required. The method continues at 205, with writing the buffered data to a PCMS array, or some other suitable non-volatile staging buffer. The method may further include at 207 acknowledging to the host that the write to the PCMS (or other suitable staging buffer) is complete. The method continues with a determination at 209, with respect to whether the PCMS or other staging buffer threshold has been met. This threshold may be met, for example, when three word lines of data are stored, although any number of other thresholds can be used, as will be appreciated in light of this disclosure. In any case, if the staging buffer threshold is not met, the method repeats at 201 and continues to receive data to be written to the storage system. If, on the other hand, the staging buffer threshold is met, the method continues at 211 with moving the PCMS data to a flash array (e.g., NAND) using the sequential interleaved programming routine. Note that other memory types can be used here as well, and the methodology is not intended to be limited to PCMS and NAND flash schemes only, as previously explained. The details of the programming routine at 211 according to two example embodiments will be further described with reference to FIGS. 2b and 2c, respectively.

Figure 2B:
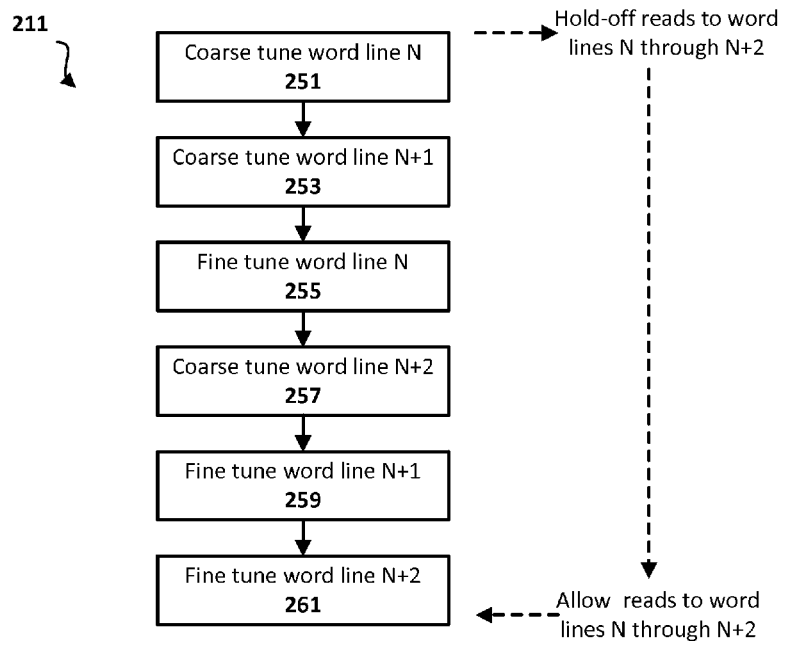

As can be seen with reference to FIG. 2b, the programming sequence at 211 of this example embodiment includes the programming of three consecutive word lines: word line n, word line n+1, and word line n+2. The programming routine commences at 251 with coarse tuning word line N. Further note that once the programming sequence commences, reads to the word lines N, N+1, and N+2 are held until the programming sequence is completed, as shown in dashed line (e.g., processor 101 may buffer received read requests into a FIFO queue for subsequent processing or otherwise delay issuance of reads until programming sequence is complete). The programming routine continues at 253 with coarse tuning word line N+1, and then fining tuning word line N at 255. Note that any impact of the coarse programming at 253 on word line n is mitigated by the fine tuning of word line n at 255. The programming routine continues at 257 with coarse tuning word line N+2, and then fine tuning word line N+1 at 259. Note that any impact of the coarse programming at 257 on word line n+1 is mitigated by the fine tuning of word line n at 259. The programming routine then finishes at 261 with fine tuning word line N+2. Thus, the programming routine allows for programming three consecutive word lines worth of content. One each of the three word lines has been programmed to its final state, reads to those word lines may be released. Otherwise, note that reads may interfere with the state resulting in bit error rate.

Figure 2C:
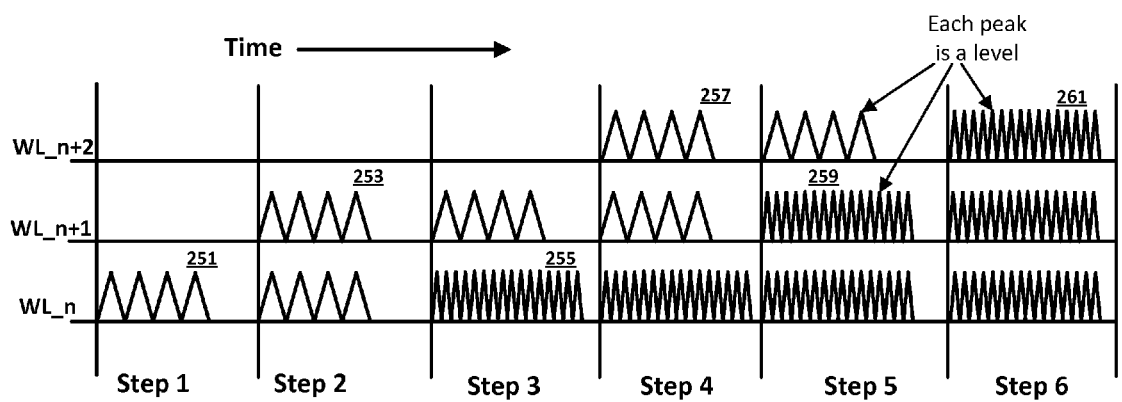

FIG. 2c shows another more example embodiment of a programming routine that can be used at 211. This example is similar to the example of FIG. 2b, so similar reference labels are used, but in this example case each word line is partitioned into four pages: a first page for the first of the 4-bits per cell in the given word line, a second page for the second of the 4-bits per cell in the given word line, a third page for the third of the 4-bits per cell in the given word line, and a fourth page for the fourth of the 4-bits per cell in the given word line. Further assume the flash memory is implemented with QLC NAND, according to one example embodiment, although other multilevel programmable memories may be used as well. As can be further seen, three consecutive word lines (or twelve pages) are programmed in a six step sequential process as follows: at step 1, pages 0 and 1 of WLn are coarse programmed to intermediate voltage levels, as shown at 251. Note the number of peaks shown corresponds to the number of cell levels programmed, which is four in this example case. At step 2, pages 2 and 3 of WLn+1 are coarse programmed to intermediate voltage levels, as shown at 253; at step 3, pages 4 and 5 (along with coarsely programmed pages 0 and 1) of WLn are fine programmed to target voltage levels. All pages of WLn are now fully programmed, as shown at 255, with all sixteen levels programmed (as indicated by 16 peaks). As previously explained, note that any impact of the coarse programming at step 2 on the initial programming of WLn at step 1 is mitigated during fine programming of WLn at step 3). At step 4, pages 6 and 7 of WLn+2 are coarse programmed to intermediate voltage levels. At step 5, pages 8 and 9 (along with coarsely programmed pages 2 and 3) of WLn+1 are fine programmed to target voltage levels. Again, note that any impact of the coarse programming at step 4 on the earlier programmed WLn+1 at step 2 has been mitigated during fine programming of WLn+1 at step 5. At step 6, pages 10 and 11 (along with coarsely programmed pages 6 and 7) of word line n+2 are fine programmed to target voltage levels. Upon conclusion of the sequential and interleaved programming process, all four cell levels for all three word lines (including 4 pages per word line for a total of twelve pages) are fully programmed.

Thus, twelve pages of data are written per die every iteration, and reads to the twelve pages are held off until all content is written. To satisfy these two points, the host writes are buffered in a non-volatile media (e.g., PCMS) first, according to one such embodiment. If DRAM buffering is used, any flushes or Forced Unit Access (FUA) writes may be held back and not completed to the host until the write iteration in QLC is complete as both these commands expect data to be held non-volatile before receiving an acknowledgement from storage system. Hence, PCMS is recommended as the write staging buffer media (rather than, for instance, an SLC NAND region partitioned from the QLC array, which would require FUA writes and flushes be held off until QLC write iteration is complete), as PCMS can continue to accept writes while QLC interleaved write iteration is in progress. So, for instance, assume that NAND write operations are 16-64 KB depending on implementation, and FUA/flush involves 512 B of data. A PCMS, with 256 B write granularity, can complete the write in fewer than 10 micro-seconds, while the NAND can take 500 micro-seconds in SLC mode to 5000 micro-seconds in QLC mode.

There are a number of benefits of the techniques provided herein, depending on the configuration employed. For instance, there is a significant reduction (e.g., 3× reduction) in SSD controller data buffer size when PCMS is employed, as well as low latency (<1 uSec), high read bandwidth (1600+MB/Sec), untangled concurrency (PCMS read is concurrent with QLC programming), uniquely enables PCMS to reduce any SRAM requirement of the SSD controller. Further note that some of the buffers can be reused. For example, reused buffers in the example shown in FIG. 2c include: step 1 & step 4; step 2 & step 6; step 3 & step 5. Further note that NAND has another mode of parallelism called planar parallelism where 'n' number of erase blocks can be programmed simultaneously (3D NAND flash memory has 4 planes).

So, an example configuration of 500 GB QLC SSD with 3D NAND would have six NAND dies. Assuming that each of three word lines is programmed with both an initial coarse programming followed by fine programming effectively means that there are six pages of buffering per die. The SSD controller data buffer size=6 pages*number of dies*number of planes*KB/page, which equals 6*6*4*16 KB, or 2.3 MB. With PCMS buffering writes, reads from PCMS can occur at 1600 MB/Sec for any granularity of reads from 256 B+ (in multiples of 256 B). This eliminates the need to buffer content that are not actively being programmed, cutting the buffer size in half. Further, PCMS read bandwidth is far greater than the NAND channel transfer speed. Hence there is no need to buffer content greater than the number of NAND channels. Typically four NAND channels are present in client SSDs. The SSD controller transfer buffer size=3 pages*number of NAND channels*number of planes*16 KB, or 0.76 MB. In some specific embodiments, Thus, an SSD or other storage system configured in accordance with an embodiment may provide a number of benefits such as faster sustained QLC write performance, better quality of service (QoS) for FUA and Flush operations, and low cost including elimination of DRAM for buffering (and other uses) and capacitor elimination for lower page corruption. As is known, lower page corruption refers to data loss that occurs during surprise power loss in the middle of a programming sequence. In more detail, entire pages are typically programmed simultaneously and arranged in lower and upper pages. Because the lower pages are generally easier and faster to program, the translation table or so-called flash translation layer (FTL) between the logical block address (LBA) and the physical location favors lower pages when programming new data from the host. But this lower page programming can be corrupted if the surprise power loss occurs during the subsequent upper page programming. Storage capacitors are typically used to temporarily hold the bottom page programming level prior to commencing programming of the upper page. Such capacitors for avoiding lower page corruption are not needed, according to an embodiment of the present disclosure.

Example Computing System

Figure 3:
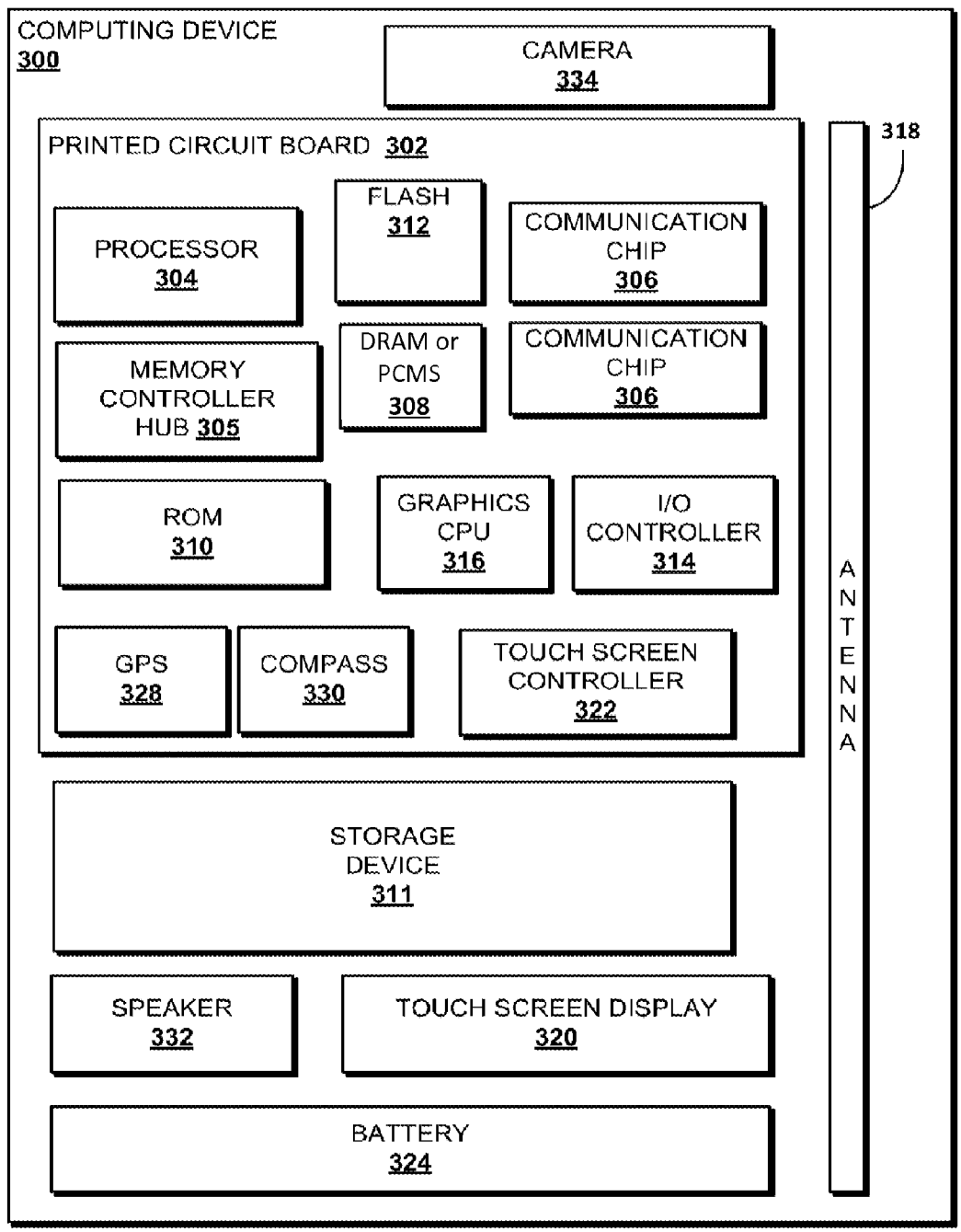
FIG. 3 illustrates a computing device having one or more storage systems configured in accordance with an embodiment of the present disclosure.

FIG. 3 illustrates an example computing device 300 which may employ the apparatuses and/or methods described herein (e.g., storage system of FIG. 1, methodologies of FIGS. 2a-c), in accordance with various embodiments. As shown, computing device 300 may include a number of components, such as one or more processor(s) 304 (one shown) and at least one communication chip 306. In various embodiments, the one or more processor(s) 304 each may include one or more processor cores. In various embodiments, the at least one communication chip 306 may be physically and electrically coupled to the one or more processor(s) 304. In further implementations, the communication chip 306 may be part of the one or more processor(s) 304. In various embodiments, computing device 300 may include printed circuit board (PCB) 302. For these embodiments, the one or more processor(s) 304 and communication chip 306 may be disposed thereon. In alternate embodiments, the various components may be coupled without the employment of PCB 302.

Depending on its applications, computing device 300 may include other components that may or may not be physically and electrically coupled to the PCB 302. These other components include, but are not limited to, memory controller hub 305, volatile memory such as DRAM 308, non-volatile memory such as PCMS 308 (supplement or alternative to DRAM 308), read only memory 310 (ROM), flash memory 312, and storage device 311 (e.g., an SSD or a hard-disk drive (HDD)), an I/O controller 314, a digital signal processor (not shown), a crypto processor (not shown), a graphics processor 316, one or more antenna 318, a display (not shown), a touch screen display 320, a touch screen controller 322, a battery 324, an audio codec (not shown), a video codec (not shown), a global positioning system (GPS) device 328, a compass 330, an accelerometer (not shown), a gyroscope (not shown), a speaker 332, a camera 334, and a mass storage device (such as hard disk drive, a solid state drive, compact disk (CD), digital versatile disk (DVD)) (not shown), and so forth. In various embodiments, the processor 304 may be integrated on the same die with other components to form a System on Chip (SoC).

In some embodiments, the DRAM/PCMS 308, flash memory 312, and storage device 311 may implement a storage system as described herein, such as the system shown in FIG. 1 or described with respect to FIGS. 2a-c. In some cases, note that the computing device 300 may include the storage device 311 that includes the DRAM/PCMS 308 and flash memory 312, rather than having those modules separate from device 311. In still other embodiments, the storage device 311 implements an SSD configured as variously described herein to carry out sequential and interleaved programming process, and DRAM/PCMS 308 and flash memory 312 can be additional such memories that supplement similar memories within the device 311.

In some embodiments, the one or more processor(s), flash memory 312, and/or storage device 311 may include associated firmware (not shown) storing programming instructions configured to enable computing device 300, in response to execution of the programming instructions by one or more processor(s) 304, to practice all or selected aspects of the methods described herein (e.g., methods of FIGS. 2a-c). In various embodiments, these aspects may additionally or alternatively be implemented using hardware separate from the one or more processor(s) 304, DRAM/PCMS 308, flash memory 312, or storage device 311.

The communication chips 306 may enable wired and/or wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to IEEE 702.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

In various implementations, the computing device 300 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 300 may be any other electronic device that processes or otherwise stores data.

Further Example Embodiments

The following examples pertain to further embodiments, from which numerous permutations and configurations will be apparent.

Example 1 is a method for programming a non-volatile memory device having a plurality of word lines each operatively coupled to a plurality of multi-level storage cells, the method comprising: programming word line n to an intermediate voltage level; programming word line n+1 to an intermediate voltage level; programming word line n to its target voltage level; programming word line n+2 to an intermediate voltage level; programming word line n+1 to its target voltage level; and programming word line n+2 to its target voltage level; wherein no reads are allowed until all the levels in a given cell are programmed.

Example 2 includes the subject matter of Example 1, wherein the programming of a given word line is carried out using a sawtooth pattern of programming voltage.

Example 3 includes the subject matter of Example 1 or 2, wherein the non-volatile memory device comprises NAND flash memory.

Example 4 includes the subject matter of any of the previous Examples, and further includes at least one of: receiving data to be written to the non-volatile memory from a host; and buffering the data in a temporary storage.

Example 5 includes the subject matter of Example 4, wherein the temporary storage is a volatile memory, the method further comprising: moving the data from the volatile memory to the non-volatile memory using the programming of word lines n, n+1, and n+2.

Example 6 includes the subject matter of Example 4 or 5, and further includes: writing the data from the temporary storage to a phase change memory with switch (PCMS) using a PCMS controller. Other embodiments may include other memory types, and the present disclosure is not intended to be limited to PCMS technology.

Example 7 includes the subject matter of Example 6, wherein in response to a sufficient amount of the data being stored in the PCMS, the method further comprises: moving the data from the PCMS to the non-volatile memory using the programming of word lines n, n+1, and n+2.

Example 8 includes the subject matter of any of the previous Examples, wherein each word line is partitioned into four pages: a first page for the first of 4-bits per cell in a given word line, a second page for the second of the 4-bits per cell in the given word line, a third page for the third of the 4-bits per cell in the given word line, and a fourth page for the fourth of the 4-bits per cell in the given word line.

Example 9 includes the subject matter of any of the previous Examples, wherein each word line is partitioned into four pages, such that writing content from each of word lines n, n+1, and n+2 provides twelve pages of data including page 0 through page 11, and wherein: programming word line n to an intermediate voltage level includes coarse programming pages 0 and 1; programming word line n+1 to an intermediate voltage level includes coarse programming pages 2 and 3; programming word line n to its target voltage level includes fine programming pages 4 and 5, along with pages 0 and 1; programming word line n+2 to an intermediate voltage level includes coarse programming pages 6 and 7; programming word line n+1 to its target voltage level includes fine programming pages 8 and 9, along with pages 2 and 3; and programming word line n+2 to its target voltage level includes fine programming pages 10 and 11, along with pages 6 and 7.

Example 10 is a storage controller device, comprising: one or more memory controllers configured to control or otherwise facilitate movement of staged data from a staging buffer to a non-volatile memory, the non-volatile memory having a plurality of word lines each operatively coupled to a plurality of storage cells, at least one of the one or more controllers configured to: program word line n to an intermediate voltage level; program word line n+1 to an intermediate voltage level; program word line n to its target voltage level; program word line n+2 to an intermediate voltage level; program word line n+1 to its target voltage level; and program word line n+2 to its target voltage level; wherein no reads are allowed until all the levels in a given cell are programmed.

Example 11 includes the subject matter of Example 10, wherein the one or more controllers includes at least one of: a buffer controller configured to facilitate the writing of data to the staging buffer; and a controller configured to facilitate the writing of data to the non-volatile memory.

Example 12 includes the subject matter of Example 10 or 11, and further includes a temporary buffer configured to store data from a host system before that data is transferred to the staging buffer.

Example 13 includes the subject matter of any of Examples 10 through 12, and further includes the staging buffer and the non-volatile memory, the staging buffer for staging data received from a host system, and the non-volatile memory for storing data staged in the staging buffer.

Example 14 includes the subject matter of any of Examples 10 through 13, wherein the non-volatile memory comprises NAND flash memory.

Example 15 includes the subject matter of Example 14, wherein the one or more controllers includes a NAND controller configured to interface with the NAND flash memory.

Example 16 includes the subject matter of any of Examples 10 through 15, wherein the staging buffer comprises a phase change memory with switch (PCMS).

Example 17 includes the subject matter of Example 16, wherein the one or more controllers includes a PCMS controller configured to interface with the PCMS.

Example 18 includes the subject matter of any of Examples 10 through 17, wherein the staging buffer is a volatile memory.

Example 19 includes the subject matter of any of Examples 10 through 18, wherein each word line is partitioned into a plurality of pages, such that programming each of word lines n, n+1, and n+2 provides six or more pages of data.

Example 20 includes the subject matter of any of Examples 10 through 19, wherein each word line is partitioned into four pages: a first page for the first of 4-bits per cell in a given word line, a second page for the second of the 4-bits per cell in the given word line, a third page for the third of the 4-bits per cell in the given word line, and a fourth page for the fourth of the O-bits per cell in the given word line.

Example 21 includes the subject matter of any of Examples 10 through 20, wherein each word line is partitioned into four pages, such that programming each of word lines n, n+1, and n+2 provides twelve pages of data including page 0 through page 11, and wherein at least one of the one or more controllers is configured to: program word line n to an intermediate voltage level by coarse programming pages 0 and 1; program word line n+1 to an intermediate voltage level by coarse programming pages 2 and 3; program word line n to its target voltage level by fine programming pages 4 and 5, along with pages 0 and 1; program word line n+2 to an intermediate voltage level by coarse programming pages 6 and 7; program word line n+1 to its target voltage level by fine programming pages 8 and 9, along with pages 2 and 3; and program word line n+2 to its target voltage level by fine programming pages 10 and 11, along with pages 6 and 7.

Example 22 includes the subject matter of any of Examples 10 through 21, and further includes a host interface configured to receive data for storage, wherein the storage controller device is part of a computing system.

Example 23 includes the subject matter of Example 22, wherein the computing system is a mobile computing system.

Example 24 includes the subject matter of Example 23, wherein the mobile computing system is a laptop, tablet or smart phone.

Example 25 includes the subject matter of any of Examples 10 through 24, wherein at least one of the one or more controllers is configured to hold reads so that no reads are allowed until all the levels in a given cell are programmed. In one such case, the at least one controller is configured to delay or otherwise temporarily suppress issuance of a read to a given cell until all the levels in that cell are programmed.

Example 26 includes the subject matter of Example 25, wherein the held reads are buffered.

Example 27 is a solid-state storage system, comprising: a host interface configured to receive data for storage; a phase change memory with switch (PCMS) configured to stage data received by the host interface; a PCMS controller configured to facilitate the writing of data to the PCMS; NAND flash memory configured to store data staged in the PCMS and having a plurality of word lines each operatively coupled to a plurality of storage cells; a NAND controller configured to facilitate the writing of data to the NAND flash memory; a processor for facilitating movement of staged data from the PCMS to the NAND flash memory, wherein the processor is configured to: program word line n to an intermediate voltage level; program word line n+1 to an intermediate voltage level; program word line n to its target voltage level; program word line n+2 to an intermediate voltage level; program word line n+1 to its target voltage level; and program word line n+2 to its target voltage level; wherein no reads are allowed until all the levels in a given cell are programmed.

Example 28 includes the subject matter of Example 27, and further includes a temporary buffer configured to store data from the host interface before that data is transferred to the PCMS.

Example 29 includes the subject matter of Example 27 or 28, wherein each word line is partitioned into four pages: a first page for the first of 4-bits per cell in a given word line, a second page for the second of the 4-bits per cell in the given word line, a third page for the third of the 4-bits per cell in the given word line, and a fourth page for the fourth of the 4-bits per cell in the given word line.

Example 30 includes the subject matter of any of Examples 27 through 29, wherein each word line is partitioned into four pages, such that programming each of word lines n, n+1, and n+2 provides twelve pages of data including page 0 through page 11, and wherein the processor is configured to: program word line n to an intermediate voltage level by coarse programming pages 0 and 1; program word line n+1 to an intermediate voltage level by coarse programming pages 2 and 3; program word line n to its target voltage level by fine programming pages 4 and 5, along with pages 0 and 1; program word line n+2 to an intermediate voltage level by coarse programming pages 6 and 7; program word line n+1 to its target voltage level by fine programming pages 8 and 9, along with pages 2 and 3; and program word line n+2 to its target voltage level by fine programming pages 10 and 11, along with pages 6 and 7.

Example 31 includes the subject matter of any of Examples 27 through 30, wherein the solid-state storage system is included in a computing system. In some such cases, the computing system is operatively coupled to the host interface.

Example 32 includes the subject matter of Example 31, wherein the computing system is a mobile computing system.

Example 33 includes the subject matter of any of Examples 27 through 32, wherein the processor is configured to hold reads so that no reads are allowed until all the levels in a given cell are programmed. In one such case, the processor is configured to delay or otherwise temporarily suppress issuance of a read to a given cell until all the levels in that cell are programmed.

Example 34 includes the subject matter of Example 33, wherein the held reads are buffered.

Example 35 is a computer program product encoded with instructions that when executed by one or more processor/controllers cause the method of any of Examples 1 through 9 to be carried out. The computer program product may be any non-transitory storage medium or multiple such mediums, such as an embedded memory within a controller or processor or other on-chip memory. In a more general sense, the computer program product can be any one or more physical non-transitory processor readable mediums. Further note that processor and controller may be used interchangeably.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. A method for programming a non-volatile memory device having a plurality of word lines each operatively coupled to a plurality of multi-level storage cells, the method comprising:
   programming word line n to an intermediate voltage level;
   programming word line n+1 to an intermediate voltage level;
   programming word line n to its target voltage level;
   programming word line n+2 to an intermediate voltage level;
   programming word line n+1 to its target voltage level;
   programming word line n+2 to its target voltage level; and
   suppressing reads to word line n, word line n+1, and word line n+2, until each of word line n, word line n+1, and word line n+2 is programmed to its target voltage level.

2. The method of claim 1 wherein the programming of a given word line is carried out using a sawtooth pattern of programming voltage.

3. The method of claim 1, further comprising at least one of:
   receiving data to be written to the non-volatile memory from a host; and
   buffering the data in a temporary storage.

4. The method of claim 3 wherein the temporary storage is a volatile memory, the method further comprising:
   moving the data from the volatile memory to the non-volatile memory using the programming of word lines n, n+1, and n+2.

5. The method of claim 3, further comprising:
   writing the data from the temporary storage to a phase change memory with switch (PCMS) using a PCMS controller.

6. The method of claim 5 wherein in response to a sufficient amount of the data being stored in the PCMS, the method further comprises:

moving the data from the PCMS to the non-volatile memory using the programming of word lines n, n+1, and n+2.

7. A storage controller device, comprising:
one or more memory controllers configured to facilitate movement of staged data from a staging buffer to a non-volatile memory, the non-volatile memory having a plurality of word lines each operatively coupled to a plurality of storage cells, at least one of the one or more controllers configured to
program word line n to an intermediate voltage level,
program word line n+1 to an intermediate voltage level,
program word line n to its target voltage level,
program word line n+2 to an intermediate voltage level,
program word line n+1 to its target voltage level,
program word line n+2 to its target voltage level, and
suppress reads to word line n, word line n+1, and word line n+2 until each of word line n, word line n+1, and word line n+2 is programmed to its target voltage level.

8. The device of claim 7 wherein the one or more controllers includes at least one of:
a buffer controller configured to facilitate the writing of data to the staging buffer; and
a controller configured to facilitate the writing of data to the non-volatile memory.

9. The device of claim 7, further comprising:
a temporary buffer configured to store data before that data is transferred to the staging buffer.

10. The device of claim 7 further comprising the staging buffer and the non-volatile memory, the staging buffer configured to stage data received from a host system, and the non-volatile memory configured to store data staged in the staging buffer.

11. The device of claim 7 wherein the non-volatile memory comprises NAND flash memory, and the one or more controllers includes a NAND controller configured to interface with the NAND flash memory.

12. The device of claim 7 wherein the staging buffer comprises a phase change memory with switch (PCMS), and the one or more controllers includes a PCMS controller configured to interface with the PCMS.

13. The device of claim 7 wherein the staging buffer is a volatile memory.

14. The device of claim 7 wherein each word line is partitioned into a plurality of pages, such that programming each of word lines n, n+1, and n+2 provides six or more pages of data.

15. The device of claim 7 wherein each word line is partitioned into four pages: a first page for the first of 4-bits per cell in a given word line, a second page for the second of the 4-bits per cell in the given word line, a third page for the third of the 4-bits per cell in the given word line, and a fourth page for the fourth of the 4-bits per cell in the given word line.

16. The device of claim 7 wherein each word line is partitioned into four pages, such that programming each of word lines n, n+1, and n+2 provides twelve pages of data including page 0 through page 11, and wherein at least one of the one or more controllers is configured to:
program word line n to an intermediate voltage level by coarse programming pages 0 and 1;
program word line n+1 to an intermediate voltage level by coarse programming pages 2 and 3;
program word line n to its target voltage level by fine programming pages 4 and 5, along with pages 0 and 1;
program word line n+2 to an intermediate voltage level by coarse programming pages 6 and 7;
program word line n+1 to its target voltage level by fine programming pages 8 and 9, along with pages 2 and 3; and
program word line n+2 to its target voltage level by fine programming pages 10 and 11, along with pages 6 and 7.

17. The device of claim 7, further comprising a host interface configured to receive data for storage, wherein the device is part of a computing system.

18. The device of claim 7 wherein at least one of the one or more controllers is configured to suppress reads by holding reads or delaying issuance of reads.

19. The device of claim 18 wherein the held reads are buffered.

20. A solid-state storage system, comprising:
a host interface configured to receive data for storage;
a phase change memory with switch (PCMS) configured to stage data received by the host interface;
a PCMS controller configured to facilitate the writing of data to the PCMS;
NAND flash memory configured to store data staged in the PCMS and having a plurality of word lines each operatively coupled to a plurality of storage cells;
a NAND controller configured to facilitate the writing of data to the NAND flash memory;
a processor configured to facilitate movement of staged data from the PCMS to the NAND flash memory, wherein processor is configured to
program word line n to an intermediate voltage level,
program word line n+1 to an intermediate voltage level,
program word line n to its target voltage level,
program word line n+2 to an intermediate voltage level,
program word line n+1 to its target voltage level,
program word line n+2 to its target voltage level, and
suppress reads to word line n, word line n+1, and word line n+2 until each of word line n, word line n+1, and word line n+2 is programmed to its target voltage level.

21. The system of claim 20 further comprising:
a temporary buffer configured to store data from the host interface before that data is transferred to the PCMS.

22. The system of claim 20 wherein each word line is partitioned into four pages: a first page for the first of 4-bits per cell in a given word line, a second page for the second of the 4-bits per cell in the given word line, a third page for the third of the 4-bits per cell in the given word line, and a fourth page for the fourth of the 4-bits per cell in the given word line.

23. The system of claim 20 wherein each word line is partitioned into four pages, such that programming each of word lines n, n+1, and n+2 provides twelve pages of data including page 0 through page 11, and wherein the processor is configured to:
program word line n to an intermediate voltage level by coarse programming pages 0 and 1;
program word line n+1 to an intermediate voltage level by coarse programming pages 2 and 3;
program word line n to its target voltage level by fine programming pages 4 and 5, along with pages 0 and 1;
program word line n+2 to an intermediate voltage level by coarse programming pages 6 and 7;
program word line n+1 to its target voltage level by fine programming pages 8 and 9, along with pages 2 and 3; and program word line n+2 to its target voltage level by fine programming pages 10 and 11, along with pages 6 and 7.

24. The system of claim 20, wherein the system is included in a computing system.

25. The system of claim 24, wherein the computing system is a mobile computing system.

* * * * *